United States Patent
Sato et al.

(10) Patent No.: US 9,865,666 B2
(45) Date of Patent: *Jan. 9, 2018

(54) ORGANIC ELECTROLUMINESCENCE DISPLAY DEVICE

(71) Applicant: Japan Display Inc., Tokyo (JP)

(72) Inventors: Toshihiro Sato, Tokyo (JP); Masamitsu Furuie, Tokyo (JP); Naoki Uetake, Tokyo (JP)

(73) Assignee: Japan Display Inc., Tokyo (JP)

( * ) Notice: Subject to any disclaimer, the term of this patent is extended or adjusted under 35 U.S.C. 154(b) by 31 days.

This patent is subject to a terminal disclaimer.

(21) Appl. No.: 15/246,812

(22) Filed: Aug. 25, 2016

(65) Prior Publication Data

US 2016/0365399 A1 Dec. 15, 2016

Related U.S. Application Data

(63) Continuation of application No. 14/471,013, filed on Aug. 28, 2014, now Pat. No. 9,472,761.

(30) Foreign Application Priority Data

Aug. 30, 2013 (JP) .................................. 2013-179268

(51) Int. Cl.
    *G02F 1/13* (2006.01)
    *G02F 1/1362* (2006.01)
    (Continued)

(52) U.S. Cl.
    CPC ...... *H01L 27/3262* (2013.01); *H01L 27/3223* (2013.01); *H01L 27/3248* (2013.01);
    (Continued)

(58) Field of Classification Search
    CPC ............. H01L 27/3244; H01L 27/3276; H01L 27/3246; H01L 27/322; H01L 27/3262;
    (Continued)

(56) References Cited

U.S. PATENT DOCUMENTS 5,132,819 A * 7/1992 Noriyama ........... G02F 1/13624
                                                349/144
5,285,301 A 2/1994 Shirahashi et al.
(Continued)

FOREIGN PATENT DOCUMENTS

CN       1735292 A     2/2006
JP    10-321367 A    12/1998
(Continued)

OTHER PUBLICATIONS

Japanese Office Action dated Feb. 14, 2017 for corresponding JP Patent Application No. 2013-179268, With Partial Translation.
(Continued)

*Primary Examiner* — Mary Wilczewski
*Assistant Examiner* — Tsz Chiu
(74) *Attorney, Agent, or Firm* — TYPHA IP LLC

(57) ABSTRACT

An organic EL display device includes: a display area and an inspection area. The display area includes a plurality of first electrodes each provided in the pixel, a light-emitting organic layer formed in the light-emitting areas and formed of a plurality of organic material layers including a light-emitting layer, and a second electrode formed to cover the display area. The inspection area includes an inspection first electrode electrically formed as at least one block in the inspection area, an inspection organic layer formed of at least one organic material layer of the plurality of organic material layers and being in contact with the inspection first electrode, and an inspection second electrode formed in contact with the inspection organic layer.

20 Claims, 9 Drawing Sheets

(51) Int. Cl.
  *G02F 1/1343* (2006.01)
  *H01L 27/32* (2006.01)
  *H01L 51/00* (2006.01)
  *H01L 51/52* (2006.01)

(52) U.S. Cl.
  CPC ...... *H01L 27/3276* (2013.01); *H01L 51/0031* (2013.01); *H01L 51/524* (2013.01); *H01L 2227/323* (2013.01)

(58) Field of Classification Search
  CPC ............. H01L 27/1251; H01L 27/3248; H01L 27/3265; H01L 27/1214; H01L 27/1229; H01L 27/1248; H01L 27/3211; H01L 27/3213
  See application file for complete search history.

(56) References Cited

U.S. PATENT DOCUMENTS

| | | | |
|---|---|---|---|
| 6,872,638 B2 * | 3/2005 | Yamazaki | B23K 26/0732 257/52 |
| 7,751,013 B2 | 6/2010 | Oke et al. | |
| 2003/0142043 A1 | 7/2003 | Matsueda | |
| 2004/0032554 A1 | 2/2004 | Yoon et al. | |
| 2005/0078240 A1 | 4/2005 | Murade | |
| 2005/0225708 A1 | 10/2005 | Oke et al. | |
| 2007/0013297 A1 | 1/2007 | Park | |
| 2007/0241664 A1 | 10/2007 | Sakamoto et al. | |
| 2008/0121901 A1 | 5/2008 | Kim et al. | |
| 2008/0284690 A1 | 11/2008 | Ko et al. | |
| 2009/0244465 A1 | 10/2009 | Oyamada | |
| 2014/0368481 A1 | 12/2014 | Tomikawa | |
| 2015/0060823 A1 | 3/2015 | Furuie | |

FOREIGN PATENT DOCUMENTS

| | | |
|---|---|---|
| JP | 2005-316468 A | 11/2005 |
| JP | 2006-072310 A | 3/2006 |
| JP | 2008-016699 A | 1/2008 |
| JP | 2009-110865 A | 5/2009 |
| JP | 2009-277549 A | 11/2009 |
| JP | 2013-084619 A | 5/2013 |
| KR | 2001-0078310 A | 8/2001 |

OTHER PUBLICATIONS

Chinese Office Action dated Oct. 9, 2016 for corresponding Chinese application No. 201410431405.0.

Korean Office Action dated Nov. 3, 2015, regarding corresponding Korean Patent Application No. 10-2014-0112515.

Taiwanese Office Action dated on Dec. 15, 2015 regarding corresponding Taiwanese Patent Application No. 103127501.

\* cited by examiner

ORGANIC ELECTROLUMINESCENCE DISPLAY DEVICE

CROSS-REFERENCE TO RELATED APPLICATION

This application is a continuation of U.S. application Ser. No. 14/471,013, filed on Aug. 28, 2014. Further, this application claims priority from Japanese Patent Application No. JP 2013-179268 filed on Aug. 30, 2013, the entire contents of which are hereby incorporated by reference into this application.

BACKGROUND OF THE INVENTION

1. Field of the invention

The present invention relates to an organic electroluminescence display device.

2. Description of Related Art

In recent years, an image display device using a self-luminous body called an organic light-emitting diode (OLED) (hereinafter referred to as an "organic EL (Electroluminescence) display device") has been put to practical use. Since the self-luminous body is used, one organic EL display device as superior an terms of visibility and response speed compared to a related-art liquid crystal display device, and in addition, a further reduction in thickness is possible because an auxiliary lighting device such as a backlight is not necessary.

Organic EL elements used in such an organic EL display device deteriorate when the organic EL elements absorb moisture. Therefore, measures are provided in an organic EL panel such as bonding a sealing glass substrate with a resin onto a TFT (Thin Film Transistor) substrate in which a light-emitting layer is formed to hermetically seal the substrates together.

JP 10-321367 A discloses an evaluation device that detects current leakage in pixels in a display area of the organic EL display.

SUMMARY OF THE INVENTION

Over a surface of the TFT substrate, a sealing film is formed so as to cover the entire surfaces of a display area and a peripheral circuit area. However, it is own that if the sealing film has a defect, the light-emitting layer deteriorates due to moisture in she outside air entering through the defect. The defect of the sealing film can be detected as a dark spot in an inspection process when the defect occurs in the display area. However, when the defect occurs outside the display area (and inside a moisture blocking area described later), the defect cannot be immediately detected as a dark spot, involving the possibility of suffering from a lighting failure occurring from outside the display area with time on the market, that is, a display failure called a dark edge.

For preventing the occurrence of such a dark edge on the market, it is considered to perform aging processing in the manufacturing process to check the presence or absence of the dark edge, which may, however, increase the manufacturing cost and reduce the throughput.

The invention has been made in view of the circumstances described above, and it is an object of the invention to provide an organic electroluminescence display device whose manufacturing cost is suppressed and in which the occurrence of lighting failure after shipping is suppressed.

An organic electroluminescence display device according to an aspect of the invention includes: a display area in which pixels each having a light-emitting area that emits light are arranged in a matrix; and an inspection area formed around the display area, wherein the display area includes a plurality of first electrodes each provided in the pixel, a light-emitting organic layer formed in the light-emitting areas and formed of a plurality of organic material layers including a light-emitting layer, and a second electrode formed to cover the display area, and the inspection area includes an inspection first electrode electrically formed as at least one block in the inspection area, an inspection organic layer formed of at least one organic material layer of the plurality of organic material layers and being in contact with the inspection first electrode, and an inspection second electrode formed in contact with the inspection organic layer.

In the organic electroluminescence display device according to the aspect of the invention, the inspection organic layer may be formed continuously from the at least one organic material layer of the light-emitting organic layer, and the inspection second electrode may be formed continuously with the second electrode and electrically formed as one body therewith.

In the organic electroluminescence display device according to the aspect of the invention, the inspection organic layer may be composed only of a non-light-emitting organic layer.

In the organic electroluminescence display device according to the aspect of the invention, the display area may further include a pixel separation film that is an insulating film formed in a grid pattern so as to cover edges of the plurality of first electrodes, and the pixel separation film may be continuously formed in the grid pattern of the display area also in the inspection area.

In the organic electroluminescence display device according to the aspect of the invention, a first sealing film for preventing the entry of moisture may be formed continuously in the display area and the inspection area on the second electrode and the inspection second electrode, and at least the inspection area on the first sealing film may be covered with an inspection third electrode formed of a conductive material. Further, a second sealing film for preventing the entry of moisture may be formed continuously in the display area and the inspection area on the inspection third electrode, and at least the inspection area on the second sealing film may be covered with an inspection fourth electrode formed of a conductive material.

The organic electroluminescence display device according to aspect of the invention may further include: a peripheral circuit area that is located around the inspection area and in which a circuit using a thin film transistor is arranged; and a blocking area that is formed between the inspection area and the peripheral circuit area, includes an electrode layer formed continuously from the inspection second electrode in the inspection area, and is composed only of inorganic material layers from the electrode layer to an insulating substrate that is a base material.

DETAILED DESCRIPTION OF THE INVENTION

Figure 1:
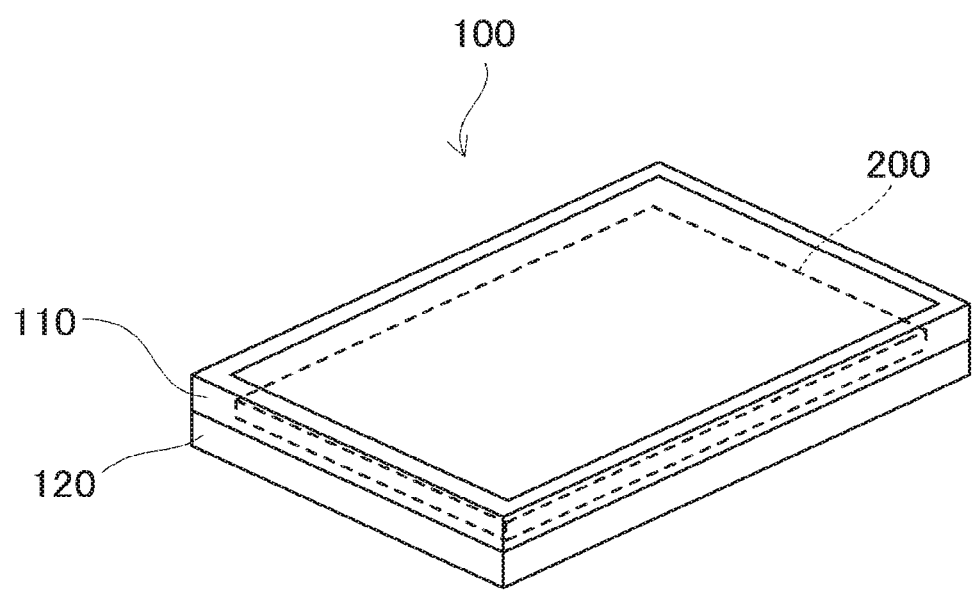
FIG. 1 schematically shows an organic EL display device according to an embodiment of the invention.

Hereinafter, an embodiment of the invention will be described with reference to the drawings. In the drawings, the same or equivalent elements are denoted by the same reference numerals and signs, and a redundant description is omitted.

FIG. 1 schematically shows an organic EL display device 100 according to the embodiment of the invention. As shown in the drawing, the organic EL display device 100 is composed of an organic EL panel 200 fixed so as to be interposed between an upper frame 110 and lower frame 120.

Figure 2:
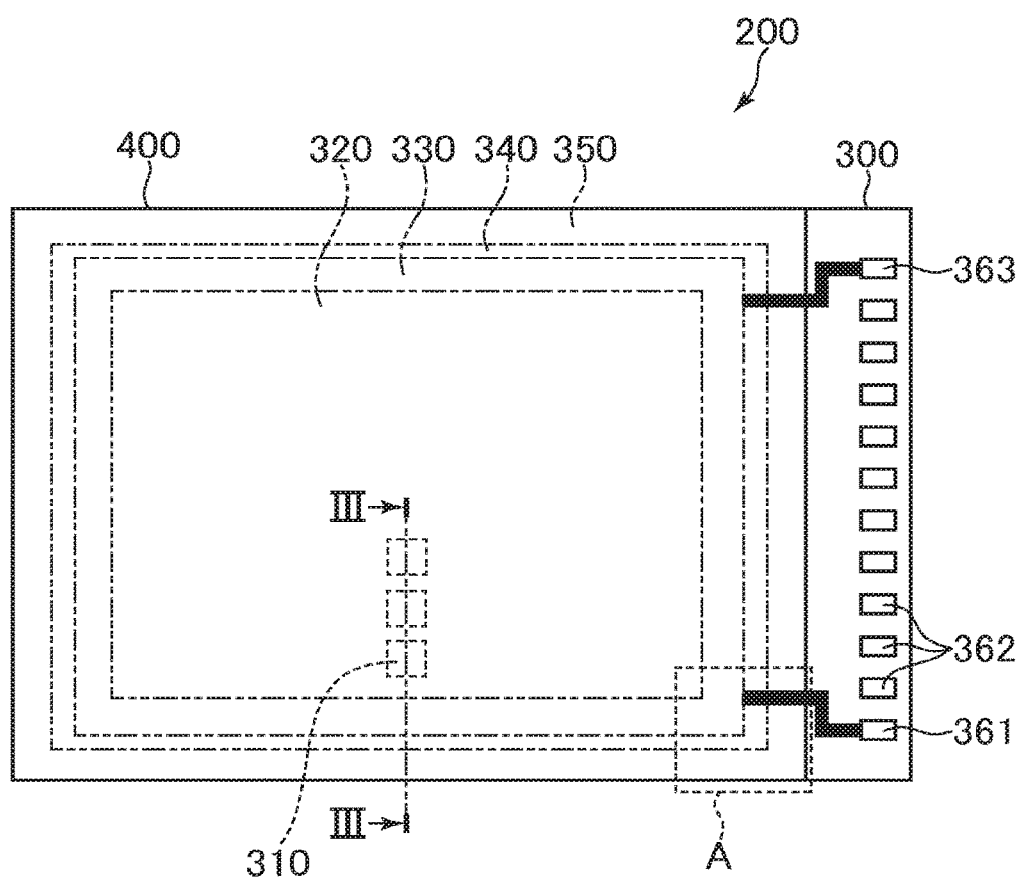
FIG. 2 is a plan view showing the configuration of an organic EL panel.

FIG. 2 is a plan view showing the configuration of the organic EL panel 200. The organic EL panel 200 is composed of a TFT substrate 300 and a sealing substrate 400 bonded to the TFT substrate 300 with a transparent resin 410 (described later). As shown in the drawing, the organic EL panel 200 includes a display area 320, a peripheral circuit area 350, a blocking area 340, and a blocking inside area 330. In the display area 320, pixels 310 each of which an anode electrode 376 (described later) is arranged and that emits light based on a gradation value are arranged in a matrix. The peripheral circuit area 350 is arranged around the display area 320, and in the peripheral circuit area 350, a circuit that applies a potential to a cathode electrode 378 (described later) is formed.

The blocking area 340 is formed between tale display area 320 and the peripheral circuit area 350, and composed only of an inorganic material from the cathode electrode 378 to a glass substrate 371 to thereby clock the ingress or egress of moisture. The blocking inside area 330 is formed between the display area 320 and the blocking area 340.

Moreover, in a portion of the TFT substrate 300 were the sealing substrate 400 is not overlapped, terminals that are extended from a circuit formed on the TFT substrate 300 to be electrically connected with the outside are exposed. The terminals include anode terminals 362 connected to the anode electrodes described later, a cathode terminal 363 connected to the cathode electrode 378 and a cathode electrode 384, and a leakage current detection terminal 361. Since moisture entering from the outside proceeds through an organic film, the moisture that has entered the peripheral circuit area 350, for example, can be prevented from entering the display area 320 by providing the blocking area 340 composed only of an inorganic material.

Figure 3:
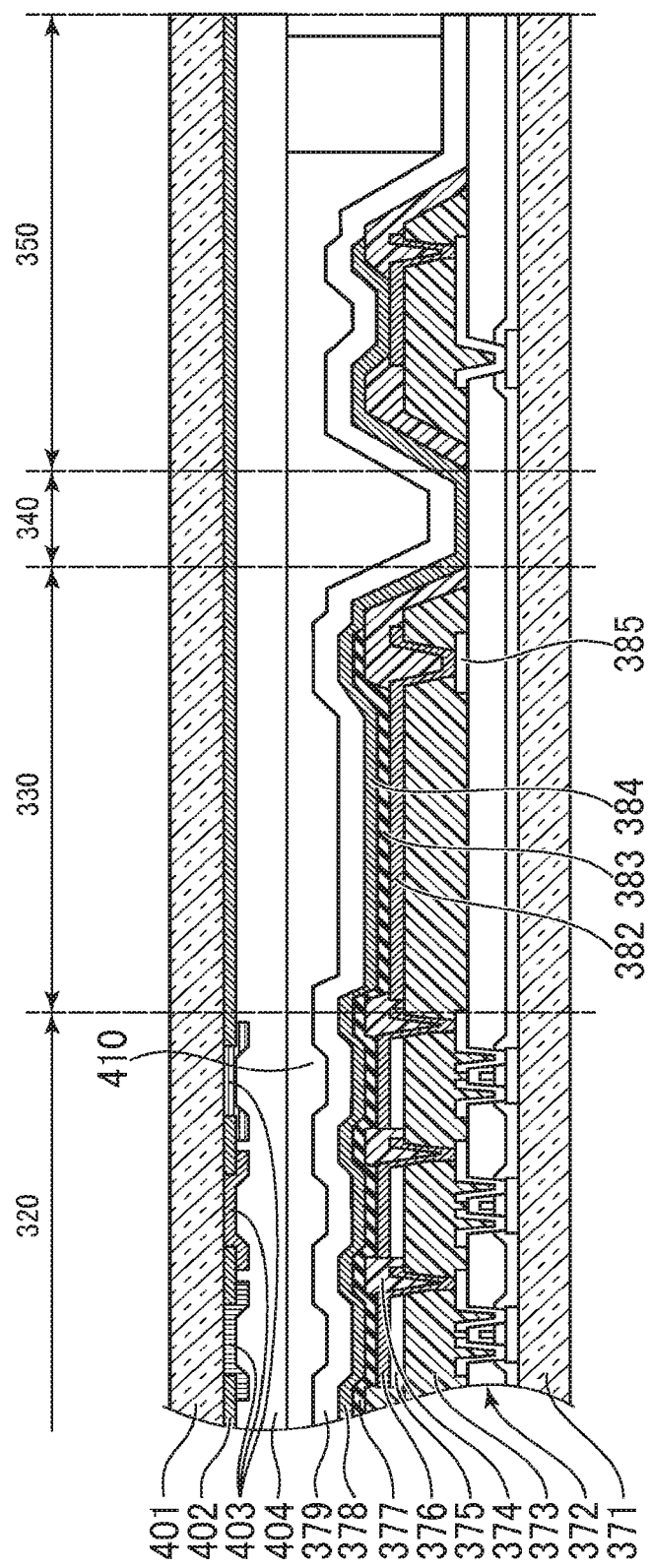
FIG. 3 is a diagram showing a cross-section taken along the line in FIG. 2.

FIG. 3 is a diagram showing a cross-section along the in FIG. 2. As shown in the drawing, the TFT substrate 300 of the organic EL panel 200 includes the glass substrate 371 that is an insulating substrate, a thin film transistor layer 372 formed on the glass substrate 371, an organic planarization film 373, organic banks (pixel separation film) 374, a reflection film 375, a light-emitting organic layer 377, the cathode electrode 378, and a sealing film 379. The thin film transistor layer 372 includes pixel circuits and peripheral circuits that include transistors formed of, for example, LTPS (Low-Temperature Poly Silicon). The organic planarization film 373 is an organic insulating film for planarizing mainly an area in which the thin film transistor layer 372 is formed. The organic banks 374 are an organic insulating film formed so as to cover edges of a conductive film of the anode electrodes 376 or the like deposited in through holes of the organic planarization film 373. The reflect on film 375 is arranged on the glass substrate 371 side of the anode electrode 376, and reflects emitted light. The light-emitting organic layer 377 is formed of a light-emitting layer that emits light and/or a common layer such as a hole transport layer or an electron injection layer. The cathode electrode 378 is an electrode facing the anode electrodes 376. The sealing film 379 is deposited so as to cover the entire surface of the TFT substrate 300, and formed of, for example, an inorganic film or a stacked structure having an inorganic film and an organic film. The inorganic film used for the sealing film 379 is formed by CVD (Chemical Vapor Deposition) or the like using SiN, SiO, or the like that is impermeable to moisture. Although, in the embodiment, the organic bank 374 formed of an organic insulating film is used, an inorganic bank formed of an inorganic insulating film may be used.

The sealing substrate 400 that is arranged above the TFT substrate 300 with the transparent resin 410 therebetween includes a glass substrate 401 that is an insulating substrate, R (red), G (green), and B (blue) color filters 403, a black matrix 402, and an overcoat layer 404. The color filters 403 each transmit light at a predetermined wavelength range in the pixel 310 mainly in the display area 320. The black matrix 402 is a light-shielding film that prevents leakage light between the pixels 310. The overcoat layer 404 is an organic material that covers the color filters 403 and the black matrix 402.

The pixel transistors that control light emission of the pixels 310 are arranged in the thin film transistor layer 372 in the display area 320, while the pixel transistor is not arranged in the blocking inside area 330. Moreover, the blocking inside area 330 includes an anode electrode 382, a light-emitting organic layer 383, and the cathode electrode 384, which are stacked in the same process as the pixel 310 the display area 320. Moreover, the light-emitting organic layer 383 and the cathode electrode 384 are formed continuously from she display area 320. The anode electrode 382 is used in common and electrically formed as one body in the blocking inside area 330, and connected via a through hole with a wire 385 of the thin film transistor layer 372. The wire 385 electrically connected with the leakage current detection terminal 361 in FIG. 2.

Although, in the embodiment, the light-emitting organic layer 383 and the cathode electrode 384 are formed continuously from the display area 320, the light-emitting organic layer 383 and the cathode electrode 384 may not be formed continuously from the display area 320 but may be divided and formed separately from the display area 320. Moreover, although, in the embodiment, the stacked structure of the light-emitting organic layer 383 in the blocking inside area 330 is similar to the stacked structure of the light-emitting organic layer 377 of the pixel 310 in she display area 320, the light-emitting organic layer 383 in the blocking inside area 330 may have a different stacked structure from that of the pixel 310 in the display area. For example, even when the lighting organic layer 377 in the display area 320 has a light-emitting layer of two layers of a so-called tandem structure, the stacked structure of the light-emitting organic layer 383 may have only one layer, or may be formed only of some of common layers such as a hole transport layer, an electron transport layer, and a charge generation layer, or the like.

Figure 4:
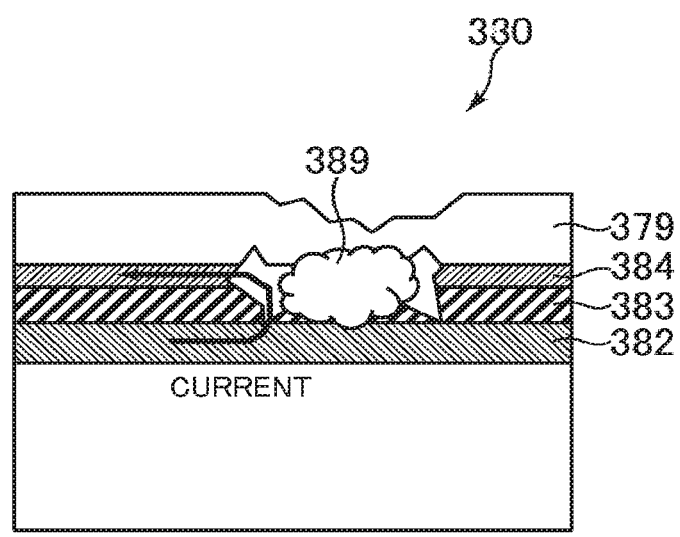
FIG. 4 is a diagram for explaining current leakage occurring when a foreign substance is mixed into a blocking inside area.

FIG. 4 is a diagram explaining current leakage occurring when a foreign substance 389 is mixed into the blocking inside area 330. For example, if the foreign substance 389 adheres to the TFT substrate 300 when forming the sealing film 379, it can be considered that the light-emitting organic layer 33 is broken together with the sealing film 379 or the cathode electrode 384 when, for example, bonding the TFT substrate 300 with the sealing substrate 400. In such a case, when a voltage is applied between the anode electrode 382 and the cathode electrode 384, a leakage current occurs. By measuring this current, the foreign substance, that is, the breakage of the light-emitting organic layer 383 or the like can be detected. In the measuring of the leakage current, the direction of voltage application may be a direction in which the light-emitting layer emits light, or may be the opposite direction.

Figure 5:
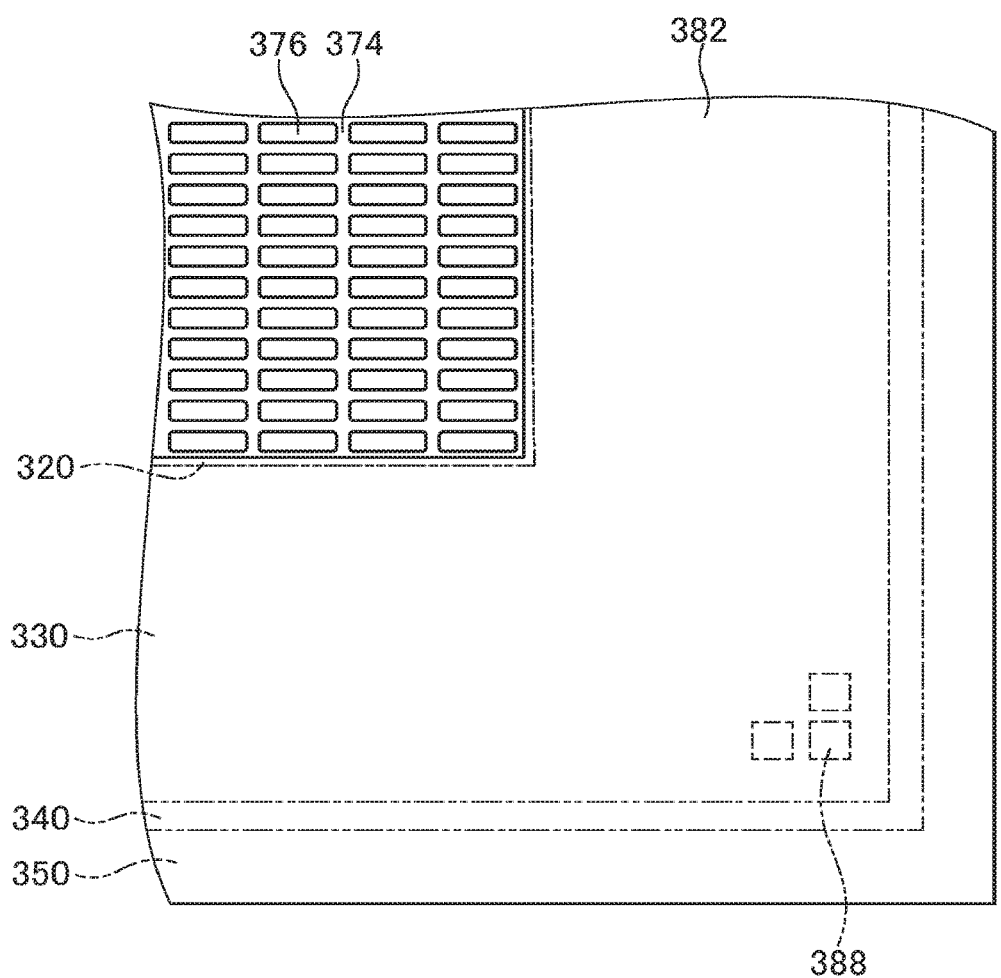
FIG. 5 is an enlarged view showing an area indicated by A in FIG. 2.

FIG. 5 is an enlarged view of an area indicated by A in FIG. 2. For illustrative purposes, areas in which the anode electrodes 376 and 382 and the organic bank 374 are formed are indicated by solid lines. As shown in the drawing, in the display area 320, the anode electrodes 376 are arranged in a matrix in accordance with the arrangement of the pixels 310. The organic bank 374 is formed around each of the anode electrodes 376. In the blocking inside area 330 around the display area 320, the anode electrode 382 is arranged as one body so as to cover the blocking inside area 330. The anode electrode 382 is connected with the wire 385 at contact portions 388, and electrically connected with the leakage current detection terminal 361 that is connected to the outside.

According to the embodiment as has been described above, the current leakage between the anode electrode 382 and the cathode electrode 384 occurring when the light-emitting organic layer 383 has a defect is detected. Therefore, it is possible to easily detect a failure that has occurred in the blocking inside area 330 outside the display area 320. This can reduce a lighting failure arising from a dark edge after shipping a product thereby making it possible to further lengthen the life of the shipped product and improve the quality. Moreover, since long aging processing is not needed in an inspection before shipment, it is possible to reduce the manufacturing cost and improve the throughput.

Figure 6:
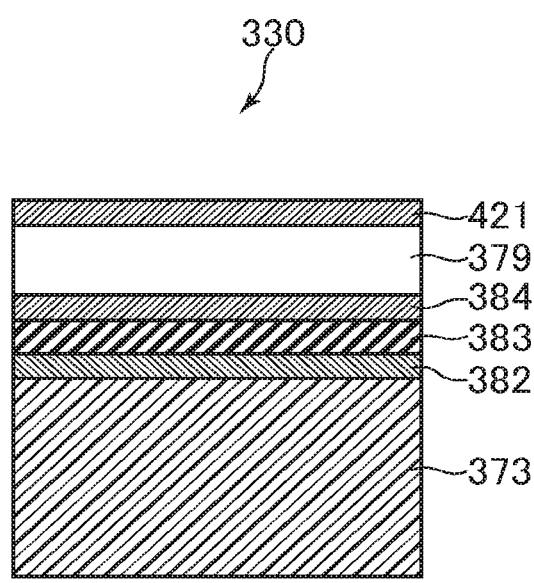
FIG. 6 is a diagram schematically showing a cross-section of the blocking inside area of an organic EL panel according to a first modified example of the embodiment.

FIG. 6 is a diagram schematically showing a cross-section of the blocking inside area 330 of an organic EL panel according to a first modified example of the embodiment. The first modified example differs from the embodiment. In that an electrode layer 421 is further provided on the sealing film 379. The electrode layer 421 is connected with the leakage current detection terminal via the through hole similarly to the anode electrode 382, making it possible to detect, a leakage current between the cat ode electrode 384 and the electrode layer 421. With the configuration described above, it is possible to inspect for a leakage current caused, not when the light-emitting organic layer 383 has a defect, but also when the sealing film 379 has a defect. Moreover, the electrode layer 421 has a heat dissipation effect or an electromagnetic wave preventing effect.

Figure 7:
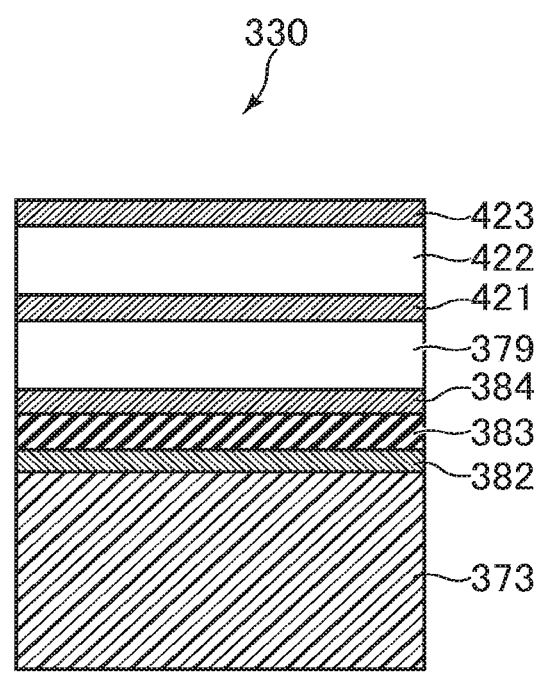
FIG. 7 is a diagram schematically showing a cross-section of the blocking inside area of an organic EL panel according to a second modified example of the embodiment.

FIG. 7 is a diagram schematically showing a cross-section of the blocking inside area 330 of an organic EL panel according to a second modified example of the embodiment in the second modified example, a sealing film 422 and an electrode layer 423 are further formed by being stacked in this order in the blocking inside area 330 of the first modified example in FIG. 6. With the configuration described above, it is further possible to inspect for a leakage current caused when the sealing film 422 has a defect.

Figure 8:
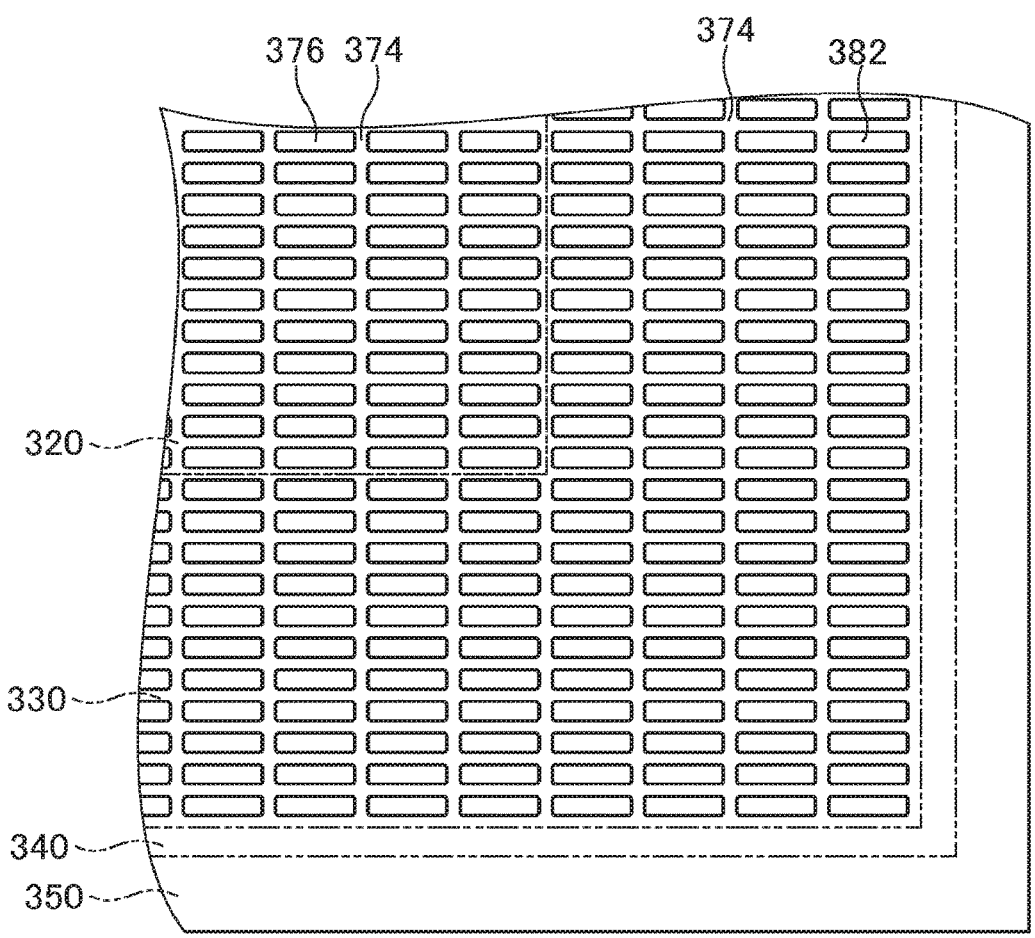
FIG. 8 is an enlarged view of an organic EL panel according to a third modified example of the embodiment in the same view as FIG. 5.

FIG. 8 is an enlarged view of an organic EL panel according to a third modified example of the embodiment in the same view as FIG. 5. Similarly to FIG. 5, areas in which the anode electrodes 376 and 382 and the organic bank 374 are formed are indicated by solid lines. As shown in the drawing, the anode electrodes 376 are arranged in a matrix in accordance with arrangement of pixels 310 in the display area 320. The organic bank 374 is formed around each of the anode electrodes 376. Further, the organic banks 374 of the same size and pitch are formed also, in the blocking inside area 330 similarly to those in the display area 320, and formed so as to fill the blocking inside area 330. The anode electrodes 382 in the blocking inside area 330 have the same size as those in the display area 320, and are electrically formed as one body. By forming the anode electrodes 382 as described above, a surface irregularity environment similar to that of the pixels 310 in the display area 320 is formed in the blocking inside area 330, so that an inspect on of a foreign substance or the like can be conducted with high accuracy. Moreover, since the anode electrodes 382 and the organic banks 374 can be formed in a similar semiconductor manufacturing process, it is possible to increase the stability of the process and improve the yield.

Figure 9:
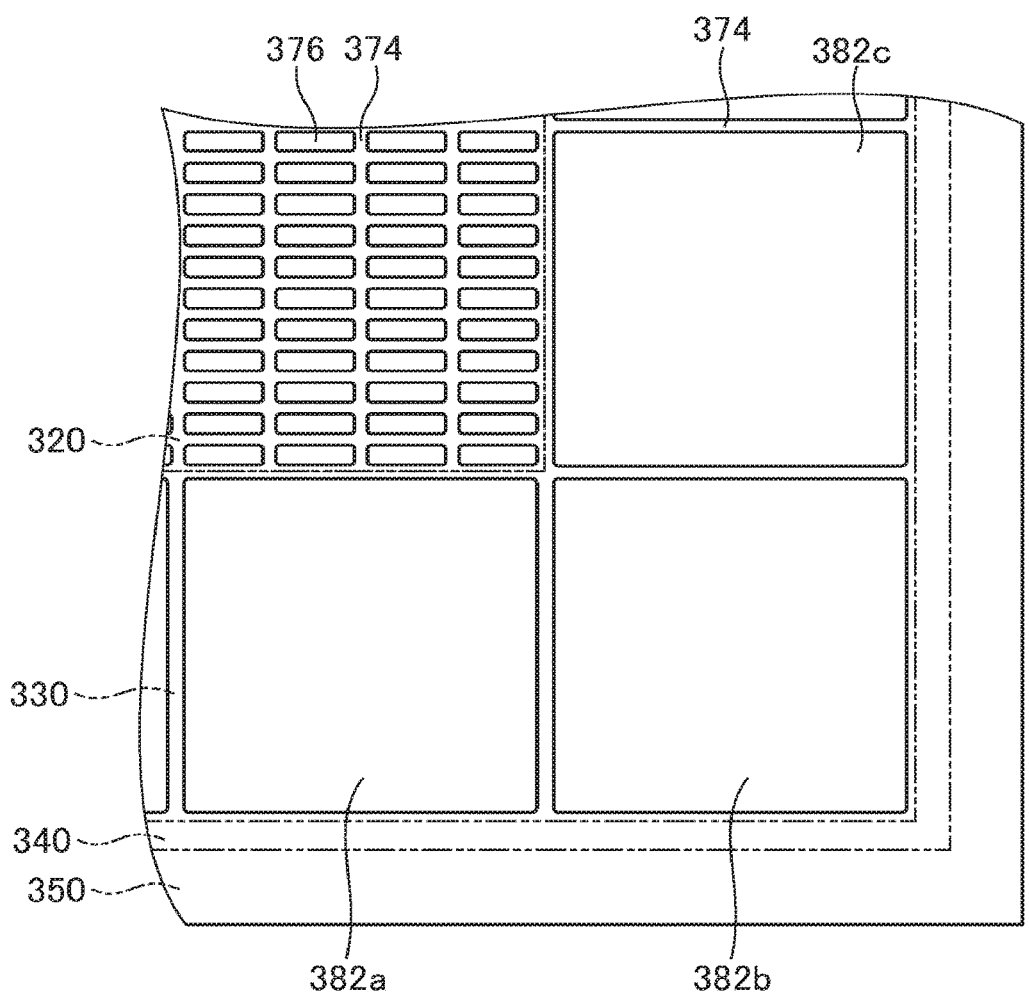
FIG. 9 is a diagram showing another modified example in the same view as FIG. 8.

FIG. 9 shows another modified example of the embodiment shown in FIG. 8. The anode electrode 382 in the blocking inside area 330 has a size corresponding to a shape in which the anode electrode 382 is continuous over a plurality of pixels, and the blocking inside area 330 is divided into a plurality of areas in which anode electrodes 382*a*, 382*b*, 382*c*, and the like are provided. In this structure, the flexibility of various layouts in she organic EL panel can be increased. The anode electrodes 382 that are obtained by dividing she anode electrode 382 into the plurality of electrodes may be wired so as to be electrically formed as one body, or may be wired to separate terminals on a block-by-block basis. When the anode electrodes 382 are wired separately on a block-by-block basis, the occurrence location causing an abnormality can be easily identified based on the block position at which a leakage current is detected, which provides an effect on process improvement or the like.

In the embodiment and modified examples described above, even when an electrical relation between the anode electrode 376 and the cathode electrode 378 is interchanged, similar effects can be obtained with similar configurations.

While there have been described what are at present considered to be certain embodiments of the invention, it will be understood that various modifications may be made thereto, and it is intended that the appended claim cover all such modifications as fall within the true spirit and scope of the invention.

What is claimed is:
1. An organic electroluminescence display device comprising:
   a substrate;
   a display area in which a plurality of pixels are arranged; and
   a first area which is located around the display area, wherein:
the display area includes
a plurality of lower electrodes located above the substrate, each of the lower electrodes provided in each of the pixels,
a plurality of organic material layers including a light-emitting layer and located on the lower electrodes, and
an upper electrode covering the display area and located on an opposite side of the organic material layers from the lower electrodes, and
the first area includes
a first electrode located above the substrate and electrically connected with a terminal, the first electrode not electrically connected with an electrode of any of thin film transistors located above the substrate,
a first organic layer including at least one of the organic material layers and being in physical contact with the first electrode, and
a second electrode being in physical contact with the first organic layer and located at an opposite side of the first organic layer from the first electrode.

2. The organic electroluminescence display device according to claim 1,
wherein the thin film transistors do not located in the first area.

3. The organic electroluminescence display device according to claim 1,
wherein the terminal is located in a terminal area including an end portion of the substrate, and
the first electrode is electrically connected with the terminal via a wire.

4. The organic electroluminescence display device according to claim 1,
wherein the at least one of the organic material layers extends from the display area to the first area continuously and comes across a boundary between the display area and the first area, and
the second electrode and the upper electrode are formed continuously as one body.

5. The organic electroluminescence display device according to claim 1,
wherein the plurality of organic material layers include a non-light-emitting layer, and
the first organic layer is composed only of the non-light-emitting layer.

6. The organic electroluminescence display device according to claim 1,
wherein a first sealing film is located in both the display area and the first area, and cover both the upper electrode and the second electrode,
the first area on the first sealing film is covered with a third electrode, and
the third electrode is located at an opposite side of the first sealing film from the second electrode.

7. The organic electroluminescence display device according to claim 6,
wherein a second sealing film is located in both the display area and the first area, and covers the third electrode,
the first area on the second sealing film is covered with a fourth electrode, and
the fourth electrode is located at an opposite side of the second sealing film from the third electrode.

8. The organic electroluminescence display device according to claim 1,
further comprising:
a second area located at an opposite side of the first area from the display area, the second electrode extending from the first area to the second area;
an inorganic film located under the lower electrodes in the display area, the first area, and the second area; and
an organic film located between the inorganic film and the lower electrodes and having a hole in the second area, the hole exposing the inorganic film,
wherein the second electrode is on and in physical contact with the inorganic film at the hole.

9. The organic electroluminescence display device according to claim 8,
further comprising a peripheral circuit area located at an opposite side of the second area from the first area and including a circuit,
wherein the second electrode overlaps the first area, the second area, and the peripheral circuit area continuously.

10. The organic electroluminescence display device according to claim 1,
wherein more than one first electrodes are provided in the first area, and
each of the first electrodes is larger than each of the lower electrodes.

11. The organic electroluminescence display device according to claim 1,
wherein more than one first electrodes are provided in the first area, and
the first electrodes are electrically connected to each other.

12. The organic electroluminescence display device according to claim 1,
wherein the first electrode is located at a same layer of the lower electrodes.

13. The organic electroluminescence display device according to claim 1,
wherein the terminal detects leakage current between the first electrode and the second electrode.

14. An organic electroluminescence display device comprising:
a display area in which a plurality of pixels are arranged; and
a first area which is located around the display area, wherein
the display area includes
a plurality of lower electrodes each provided in each of the pixels,
a plurality of organic material layers including a light-emitting layer and located on the lower electrodes, and
an upper electrode covering the display area and located on an opposite side of the organic material layers from the lower electrodes, and
the first area includes
a first electrode,
a first organic layer including at least one of the organic material layers and being in physical contact with the first electrode, the at least one organic material layer extending from the display area to the first area continuously and coming across a boundary between the display area and the first area, and
a second electrode being in physical contact with the first organic layer and located at an opposite side of the first organic layer from the first electrode.

15. The organic electroluminescence display device according to claim 14,
further comprising a substrate and thin film transistors located above the substrate,
wherein the first electrode is located above the substrate and does not electrically connected with an electrode of any of the thin film transistors.

16. The organic electroluminescence display device according to claim 14,
further comprising a substrate,
wherein the first electrode is located above the substrate,
a terminal is located in a terminal area including an end portion of the substrate, and
the first electrode is electrically connected with a terminal via a wire.

17. The organic electroluminescence display device according to claim 14,
wherein the second electrode and the upper electrode are formed continuously as one body.

18. The organic electroluminescence display device according to claim 14,
wherein more than one first electrodes are provided in the first area, and
each of the first electrodes is larger than each of the lower electrodes.

19. The organic electroluminescence display device according to claim 14,
wherein more than one first electrodes are provided in the first area, and
the first electrodes are electrically connected to each other.

20. The organic electroluminescence display device according to claim 14,
further comprising a second area located at an opposite side of the first area from the display area, the second electrode extending from the first area to the second area;
an inorganic film located under the lower electrodes in the display area, the first area, and the second area; and
an organic film located between the inorganic film and the lower electrodes and has a hole in the second area, the hole exposing the inorganic film,
wherein the second electrode is on and in physical contact with the inorganic film at the hole.

* * * * *